(12) United States Patent
Pillarisetty et al.

(10) Patent No.: US 9,640,671 B2
(45) Date of Patent: *May 2, 2017

(54) DEEP GATE-ALL-AROUND SEMICONDUCTOR DEVICE HAVING GERMANIUM OR GROUP III-V ACTIVE LAYER

(71) Applicant: Intel Corporation, Santa Clara, CA (US)

(72) Inventors: Ravi Pillarisetty, Portland, OR (US); Willy Rachmady, Beaverton, OR (US); Van H. Le, Beaverton, OR (US); Seung Hoon Sung, Beaverton, OR (US); Jessica S. Kachian, Portland, OR (US); Jack T. Kavalieros, Portland, OR (US); Han Wui Then, Portland, OR (US); Gilbert Dewey, Hillsboro, OR (US); Marko Radosavljevic, Beaverton, OR (US); Benjamin Chu-Kung, Hillsboro, OR (US); Niloy Mukherjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/134,093

(22) Filed: Apr. 20, 2016

(65) Prior Publication Data

US 2016/0233344 A1 Aug. 11, 2016

Related U.S. Application Data

(60) Continuation of application No. 14/821,561, filed on Aug. 7, 2015, now Pat. No. 9,337,291, which is a
(Continued)

(51) Int. Cl.
*H01L 29/66* (2006.01)
*H01L 29/786* (2006.01)
(Continued)

(52) U.S. Cl.
CPC .... *H01L 29/78696* (2013.01); *H01L 29/0653* (2013.01); *H01L 29/0673* (2013.01);
(Continued)

(58) Field of Classification Search
CPC ............ H01L 21/845; H01L 29/42392; H01L 29/78696
See application file for complete search history.

(56) References Cited

U.S. PATENT DOCUMENTS 6,943,087 B1 9/2005 Xiang et al.
9,337,291 B2 * 5/2016 Pillarisetty ........ H01L 29/42392
(Continued)

FOREIGN PATENT DOCUMENTS

CN 1331240 8/2007

OTHER PUBLICATIONS

Non-Final Office Action from U.S. Appl. No. 10/699,574 mailed Jul. 30, 2014, 14 pgs.
(Continued)

*Primary Examiner* — John C Ingham
*Assistant Examiner* — Frederick B Hargrove
(74) *Attorney, Agent, or Firm* — Blakely, Sokoloff, Taylor & Zafman LLP

(57) ABSTRACT

Deep gate-all-around semiconductor devices having germanium or group III-V active layers are described. For example, a non-planar semiconductor device includes a hetero-structure disposed above a substrate. The hetero-structure includes a hetero-junction between an upper layer and a lower layer of differing composition. An active layer is disposed above the hetero-structure and has a composition
(Continued)

different from the upper and lower layers of the hetero-structure. A gate electrode stack is disposed on and completely surrounds a channel region of the active layer, and is disposed in a trench in the upper layer and at least partially in the lower layer of the hetero-structure. Source and drain regions are disposed in the active layer and in the upper layer, but not in the lower layer, on either side of the gate electrode stack.

14 Claims, 6 Drawing Sheets

Related U.S. Application Data division of application No. 13/749,139, filed on Jan. 24, 2013, now Pat. No. 9,136,343.

(51) Int. Cl.
   H01L 29/165   (2006.01)
   H01L 29/06    (2006.01)
   H01L 29/205   (2006.01)
   H01L 29/423   (2006.01)
   H01L 29/78    (2006.01)

(52) U.S. Cl.
   CPC ........ *H01L 29/0676* (2013.01); *H01L 29/165* (2013.01); *H01L 29/205* (2013.01); *H01L 29/42392* (2013.01); *H01L 29/66742* (2013.01); *H01L 29/785* (2013.01); *H01L 29/78606* (2013.01); *H01L 29/78681* (2013.01); *H01L 29/78684* (2013.01)

(56) References Cited

U.S. PATENT DOCUMENTS

| | | |
|---|---|---|
| 2004/0070051 A1 | 4/2004 | Sugiyama et al. |
| 2005/0093018 A1* | 5/2005 | Ge .................. H01L 21/823807 257/192 |
| 2007/0187716 A1 | 8/2007 | Chu |
| 2010/0047973 A1 | 2/2010 | Barbe et al. |
| 2011/0012090 A1 | 1/2011 | Singh et al. |
| 2011/0014769 A1 | 1/2011 | Pouydebasque et al. |
| 2011/0062421 A1 | 3/2011 | Iwayama et al. |
| 2011/0133162 A1 | 6/2011 | Bangsaruntip et al. |
| 2011/0133280 A1* | 6/2011 | Bangsaruntip .... H01L 29/42392 257/347 |
| 2011/0147711 A1 | 6/2011 | Pillarisetty et al. |
| 2012/0149162 A1 | 6/2012 | Zhou et al. |
| 2012/0292665 A1 | 11/2012 | Marino et al. |
| 2014/0084246 A1 | 3/2014 | Pillarisetty et al. |

OTHER PUBLICATIONS

International Preliminary Report on Patentability in International Patent Application No. PCT/US2014/010836 dated Aug. 6, 2015, 6 pgs.
Non-Final Office Action from U.S. Appl. No. 10/699,574 mailed Jan. 22, 2015, 14 pgs.
Office Action and Search Report from Taiwan Patent Application No. 103101430 mailed Jan. 28, 2016, 21 pgs.
International Search Report and Written Opinion of the International Searching Authority dated Apr. 29, 2014, in International Patent Application No. PCT/US2014/010836 9 pgs.
Non-Final Office Action for Korean Patent Application No. 10-2015-7016259 mailed May 25, 2016, 7 pgs.
Non-Final Office Action from U.S. Appl. No. 14/821,561 mailed Sep. 15, 2015, 10 pgs.
Final Office Action for Chinese Patent Application No. 201480003664.1 mailed Dec. 16, 2016, 8 pgs., English translation.
First Office Action and Search Report for Taiwanese Patent Application No. 105135536 mailed Jan. 24, 2017, 6 pgs., with English translation.

\* cited by examiner

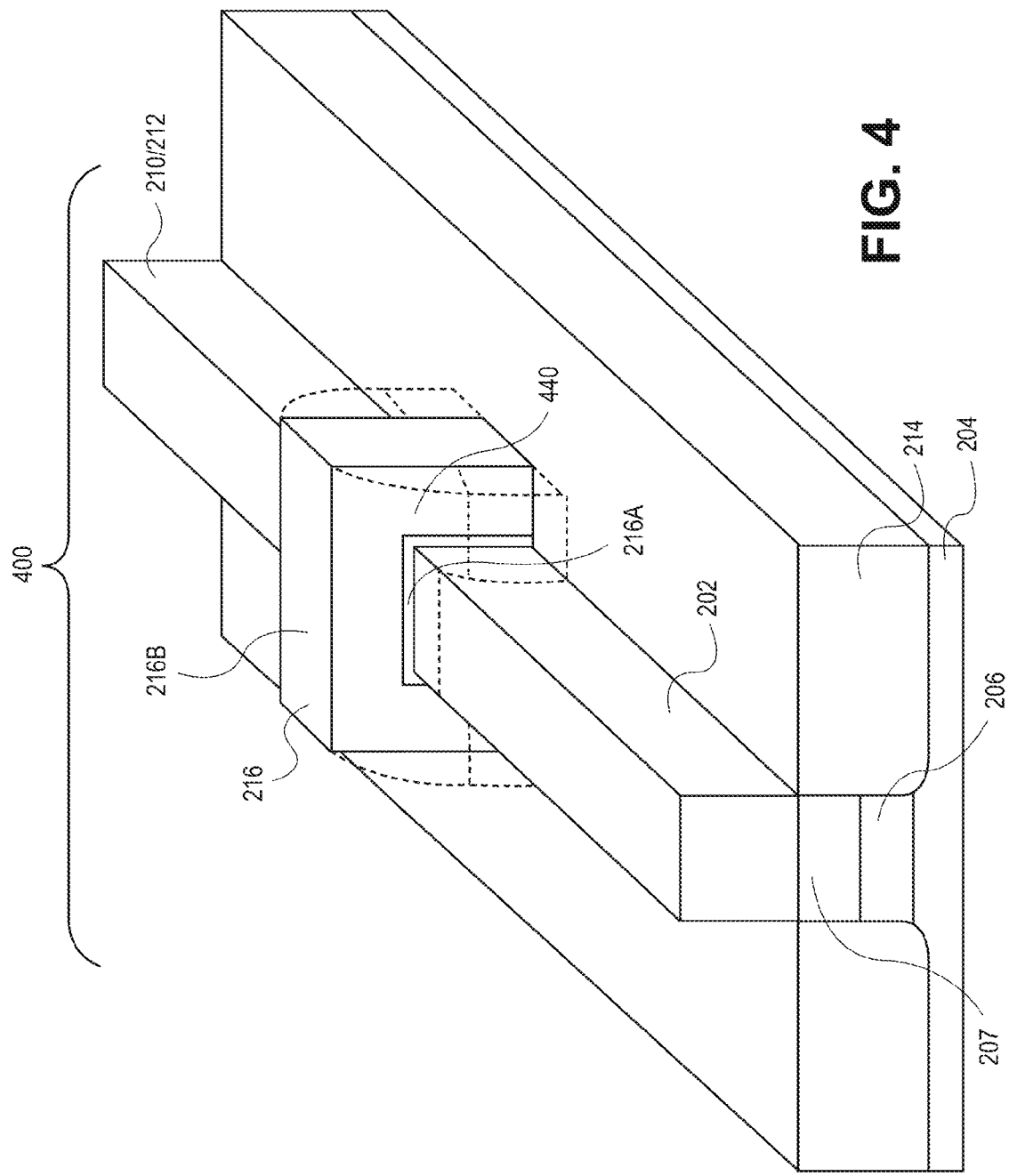

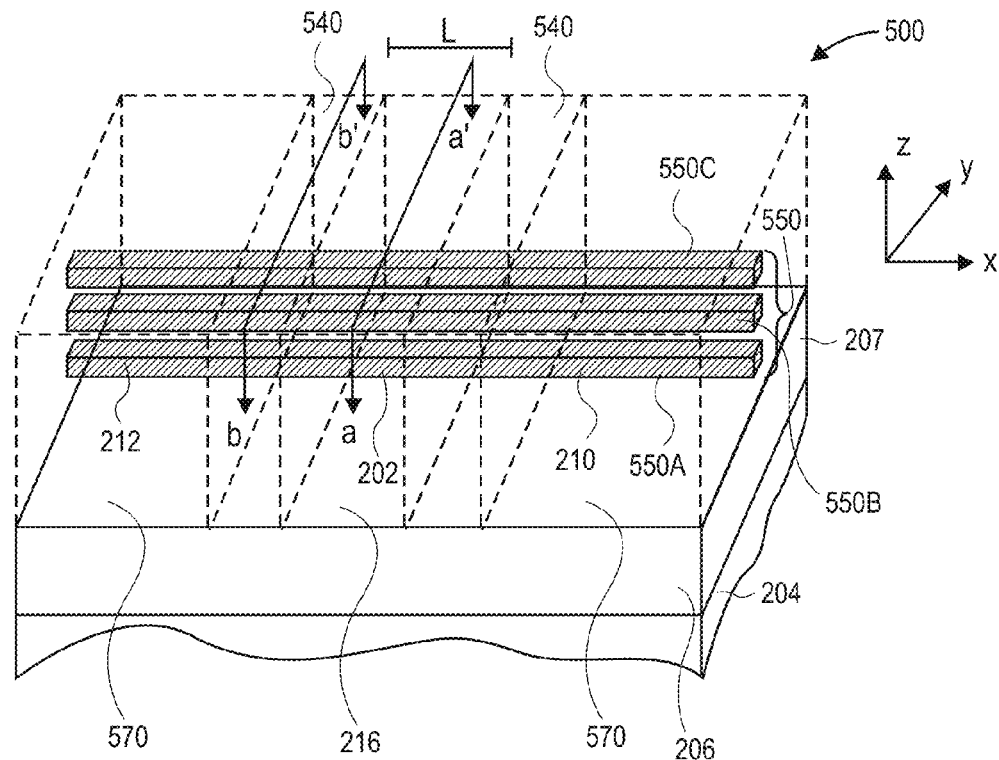
FIG. 5A
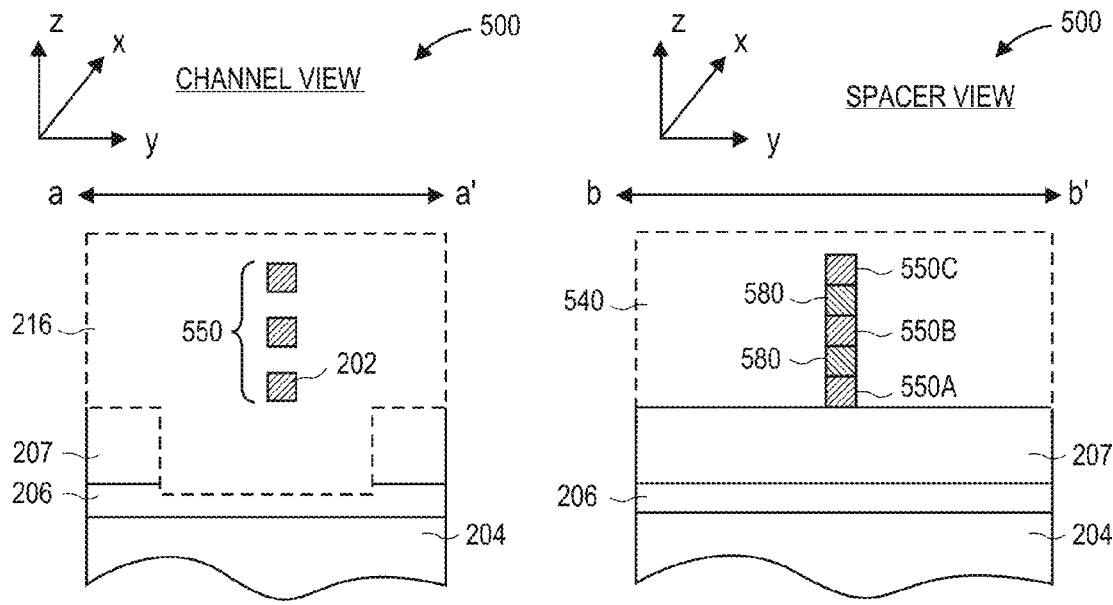
FIG. 5B  FIG. 5C

DEEP GATE-ALL-AROUND SEMICONDUCTOR DEVICE HAVING GERMANIUM OR GROUP III-V ACTIVE LAYER

CROSS-REFERENCE TO RELATED APPLICATIONS

This application is a continuation of U.S. patent application Ser. No. 14/821,561, filed on Aug. 7, 2015, which is a divisional of U.S. patent application Ser. No. 13/749,139, filed on Jan. 24, 2013, now U.S. Pat. No. 9,136,343, issued on Sep. 15, 2015 the entire contents of which are hereby incorporated by reference herein.

TECHNICAL FIELD

Embodiments of the invention are in the field of semiconductor devices and, in particular, deep gate-all-around semiconductor devices having germanium or group III-V active layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the reduced leakage they can offer.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate capacitance parasitics.

Many different techniques have been attempted to reduce junction leakage of transistors. However, significant improvements are still needed in the area of junction leakage suppression.

BRIEF DESCRIPTION OF THE DRAWINGS

FIG. 4 illustrates an angled view of a fin-fet type semiconductor device having a germanium active layer and a deep gate all-around structure, in accordance with an embodiment of the present invention.

FIG. 5A illustrates a three-dimensional cross-sectional view of a nanowire-based semiconductor structure, in accordance with an embodiment of the present invention.

FIG. 5B illustrates a cross-sectional channel view of the nanowire-based semiconductor structure of FIG. 5A, as taken along the a-a' axis, in accordance with an embodiment of the present invention.

FIG. 5C illustrates a cross-sectional spacer view of the nanowire-based semiconductor structure of FIG. 5A, as taken along the b-b' axis, in accordance with an embodiment of the present invention.

DESCRIPTION OF THE EMBODIMENTS

Deep gate-all-around semiconductor devices having germanium or group III-V active layers are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are targeted to devices having gate stacks that extend into an active region or stack, well below a depth of source and drain regions of the device. Although structurally different, the resulting ability to provide leakage suppression may be described as similar to an omega-fet style device. The deep gate-all-around devices described herein may be particularly suited for germanium or III-V material based filed effect transistors (FETs) having nanowire or nanoribbon channels. One or more embodiments described below are directed to approaches to, and the resulting structures, reducing parasitic leakage in germanium or III-V material active layer devices. For example, one or more embodiments may be particularly effective for improving performance in nanowire or gate-all-around devices.

We have made attempts to suppress leakage in high mobility devices having wrap-around gates through the use of bottom gate isolation (BGI) structures. However, the use of BGI structures in, e.g., germanium-based nanowire or nanoribbon transistor devices may be difficult to realize. For example, although a BGI structure may be suitable for suppressing leakage, the placement of the BGI structure typically needs to extend deep into an active region material layer or stack, which can be difficult to integrate. Such a BGI fabrication process also requires significantly more complex process steps and can prove to be more costly. Furthermore, in the case that a BGI structure is fabricated but not to a depth sufficient for full leakage suppression, poor interfaces formed between isolation regions and germanium-based buffer layers may generate significant surface states causing or contributing to the parasitic leakage. Generally, regardless of how generated, the parasitic leakage can hamper transistor performance since it may degrade the off state leakage of the device. Ultimately, such parasitic leakage can render fabricating a low leakage germanium-based semiconductor device difficult to achieve.

Figure 1:
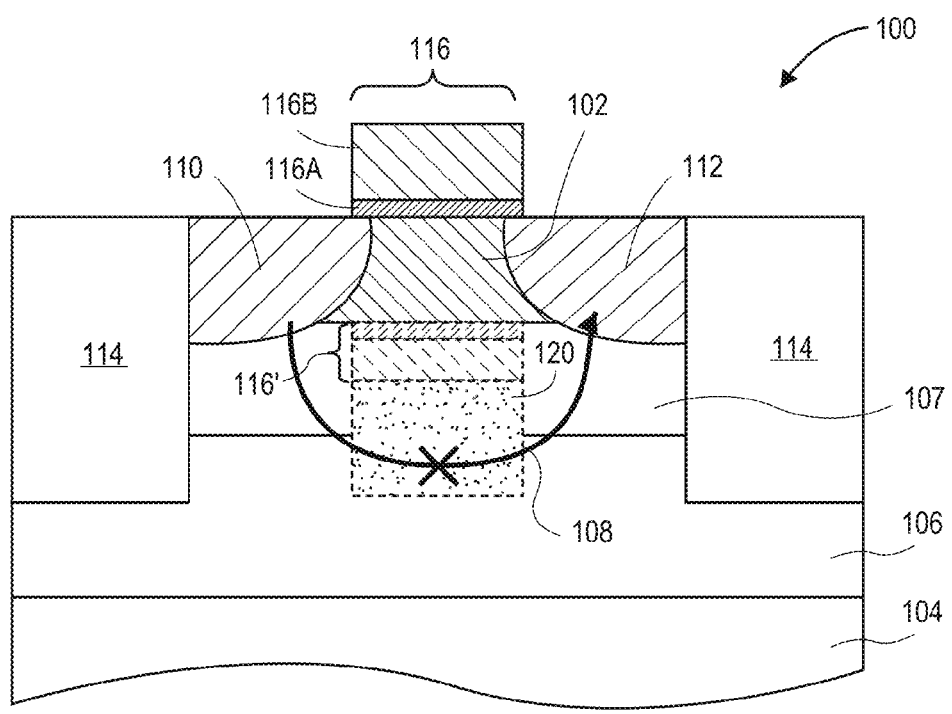
FIG. 1 illustrates a cross-sectional view of a germanium-based semiconductor device having a bottom gate isolation (BGI) structure for leakage suppression.

To exemplify the concepts described herein. FIG. 1 illustrates a cross-sectional view of a germanium-based semiconductor device having a bottom gate isolation (BGI) structure for leakage suppression. Referring to FIG. 1, a semiconductor device 100 includes a germanium (Ge) channel region 102 grown above a silicon (Si) substrate 104 (e.g., as a portion of a silicon wafer) via silicon germanium (SiGe) buffer layers 106 (e.g., a $Si_{30}Ge_{70}$ layer) and 107 (e.g., a $Si_{50}Ge_{50}$ layer) to manage lattice mismatch between Ge and Si. These SiGe buffer layers 106 and 107 are, however, fairly conductive in that they allow parallel conduction within the region underlying the channel region 102, at least within the SiGe buffer layers 106 and 107. The parallel conduction may cause parasitic leakage in the device 100, as depicted by arrow 108, from the source region 110 to the drain region 112. It is noted that FIG. 1 also depicts isolation regions 114 and a gate electrode stack 116, such as a metal gate 116B and high-k gate dielectric 116A electrode stack 116. It is to be understood that such leakage may occur even in the case of a wrap-around or nanowire arrangement, where a bottom gate electrode stack 116' disposed on a bottom gate insulator (BGI) structure 120 is included. The BGI structure 120 may be extended to provide leakage suppression (indicated by the X of arrow 108). However, as described above, this typically requires formation of BGI structure 120 deep into the stack 106/107, as shown in FIG. 1.

In order to address the above described issues, in an embodiment, a deep gate-all-around structure is fabricated in place of a BGI structure. For example, in one embodiment, a bottom portion of a gate electrode is formed well below source and drain regions of the device to provide leakage suppression for the device. In a specific such embodiment, the use of a deep gate-all-around structure in place of a BGI structure alleviates the complications and possible shortcomings associated with fabricating a BGI structure such as those described above. In an embodiment, a deep gate-all-around structure is fabricated by using a deep active region etch (such as a deep HSi etch). In one such embodiment, the deep etch is performed up front in the fabrication scheme at shallow trench isolation (STI) fabrication. In another such embodiment, the deep etch is performed later in the fabrication scheme, e.g., by recessing post replacement metal gate (RMG) poly removal.

In an embodiment, the use of deep gate-all-around structure leverages the voltage threshold (Vt) difference between Ge and SiGe layers in order to suppress any gate capacitance (Cgate) penalty that may be associated with using a deep gate structure. An example of the ability to engineer the Vt to reduce such a penalty, while still being effective for leakage suppression, is described in greater detail below in association with FIG. 6. In other embodiments, the solutions described in detail herein can readily be applied to Group III-V material systems, where similar Vt engineering may be applied to accommodate a deep gate structure.

Thus, a deep gate structure may be fabricated for a high mobility material device. As an example, FIG. 2 illustrates a cross-sectional view of a semiconductor device having a germanium active layer with a deep gate-all-around structure, in accordance with an embodiment of the present invention.

Figure 2:
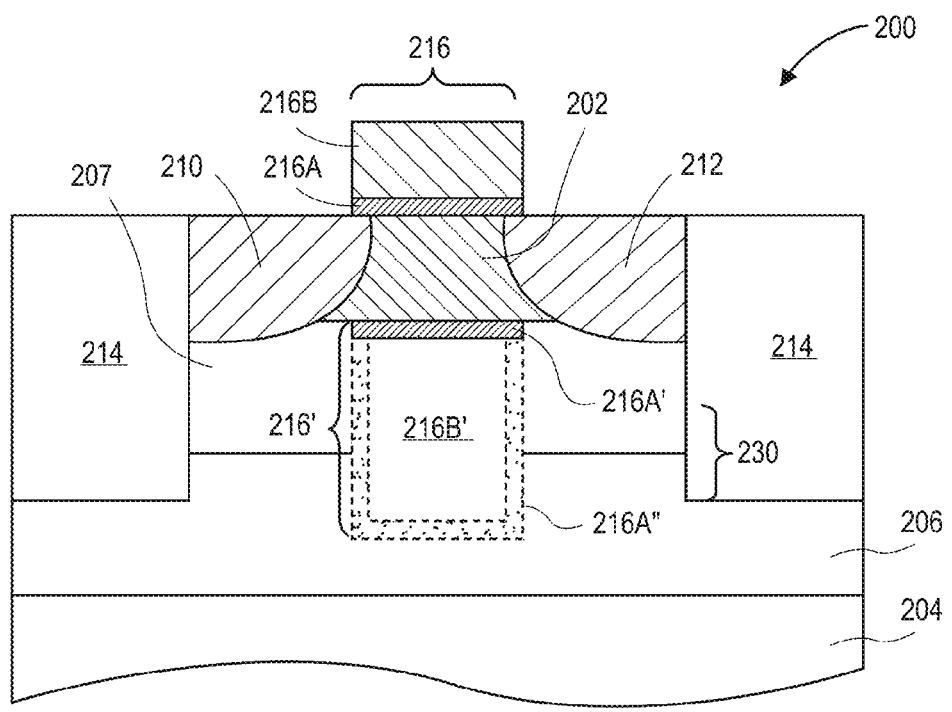
FIG. 2 illustrates a cross-sectional view of a semiconductor device having a germanium active layer with a deep gate-all-around structure, in accordance with an embodiment of the present invention.

Referring to FIG. 2, a semiconductor device 200 includes a germanium (Ge) channel region 202 grown on a silicon (Si) substrate 204 (e.g., as a portion of a silicon wafer) via silicon germanium (SiGe) buffer layers 206 (e.g., a $Si_{30}Ge_{70}$ layer) and 207 (e.g., a $Si_{50}Ge_{50}$ layer) to manage lattice mismatch between Ge and Si. These SiGe buffer layers 206 and 207 are, however, fairly conductive in that they allow parallel conduction within the region underlying the channel region 202, at least within the SiGe buffer layers 206 and 207. Semiconductor device 200 may also include isolation regions 214 and a gate electrode stack 216, such as a gate 216B and gate dielectric 216A stack 216. A wrap-around or nanowire arrangement may be formed, where a bottom gate electrode stack 216' is included, including dielectric layer portion 216A' and gate electrode portion 216B'. Source and drain regions 210 and 212, respectively, are included on either side of gate electrode stack 216, as is also depicted in FIG. 2.

Referring again to FIG. 2, the buffer layers 206 and 207 form a hetero-structure having a hetero-junction between buffer layers 206 and 207. The gate electrode stack (216+216') is disposed on and completely surrounds a channel region of the active layer 202, and is disposed in a trench formed in the buffer layer 207 and at least partially in the buffer layer 206. In an embodiment, the source and drain regions 210 and 212 are disposed in the active layer 202 and in the buffer layer 207, but not in the buffer layer 206 on either side of the gate electrode stack (216+216'). In one such embodiment, the gate electrode stack (216+216') is disposed to a depth in the hetero-structure (206+207) approximately 2-4 times a depth of the source and drain regions 210 and 212 in the hetero-structure. In another embodiment, the gate electrode stack (216+216') is disposed to a depth in the hetero-structure (206+207) deeper than a depth of the isolation regions 214. In an embodiment, the bottom portion of the gate electrode stack (i.e., portion 216') includes a portion of dielectric layer portion (i.e., portion 216A") that lines the trench of portion 216', as is depicted in FIG. 2. In one such embodiment, portion 216A" (and, hence, 216A and 216A') is a high-k gate dielectric layer.

As used throughout, the terms germanium, pure germanium or essentially pure germanium may be used to describe a germanium material composed of a very substantial amount of, if not all, germanium. However, it is to be understood that, practically, 100% pure Ge may be difficult to form and, hence, could include a tiny percentage of Si. The Si may be included as an unavoidable impurity or component during deposition of Ge or may "contaminate" the Ge upon diffusion during post deposition processing. As such, embodiments described herein directed to a Ge channel may include Ge channels that contain a relatively small amount, e.g., "impurity" level, non-Ge atoms or species, such as Si.

Referring again to FIG. 2, in an exemplary embodiment, the substrate 204 is composed essentially of silicon, the first buffer layer 206 is composed of silicon germanium with approximately 30% Si and 70% Ge, the second buffer layer 207 is composed of silicon germanium having a lower concentration of germanium than the first buffer layer 206 (e.g., 50% Ge versus 70% Ge), and the germanium active layer 202 is composed essentially of germanium. This arrangement provides a material stack having a high mobility and low bandgap material for use as a channel region. The high mobility and low bandgap material is disposed on a high bandgap material which, in turn is disposed on a medium band gap material. Other stacks providing a similar bandgap arrangement may also be used. For example, in an embodiment, an appropriate arrangement of group III-V materials in a hetero-structure may be used instead of the above described hetero-structure based on germanium and silicon germanium layers.

In an embodiment, the source and drain regions 210/212 are disposed in the germanium active layer 202 and in the second buffer layer 207, but are not formed as deep as the first buffer layer 206, as depicted in FIG. 2. FIG. 2 is shown generically to represent a variety of options. In a first embodiment, the source and drain regions are formed by doping portions of the germanium active layer 202 and in the second buffer layer 207. For example, in a specific embodiment, boron dopant atoms are implanted into germanium active layer 202 and partially into the second buffer layer 207 to form source and drain regions 210 and 212. In a second embodiment, portions of the germanium active layer 202 and the second butler layer 207 are removed and a different semiconductor material is grown to form the source and drain regions 210/212.

Substrate 204 may be composed of a semiconductor material that can withstand a manufacturing process and in which charge can migrate. In an embodiment, the substrate 204 is a bulk substrate, such as a P-type silicon substrate as is commonly used in the semiconductor industry. In an embodiment, substrate 204 is composed of a crystalline silicon, silicon/germanium or germanium layer doped with a charge carrier, such as but not limited to phosphorus, arsenic, boron or a combination thereof. In one embodiment, the concentration of silicon atoms in substrate 204 is greater than 97% or, alternatively, the concentration of dopant atoms is less than 1%. In another embodiment, substrate 204 is composed of an epitaxial layer grown atop a distinct crystalline substrate, e.g. a silicon epitaxial layer grown atop a boron-doped bulk silicon mono-crystalline substrate.

Substrate 204 may instead include an insulating layer disposed in between a bulk crystal substrate and an epitaxial layer to form, for example, a silicon-on-insulator substrate. In an embodiment, the insulating layer is composed of a material such as, but not limited to, silicon dioxide, silicon nitride, silicon oxy-nitride or a high-k dielectric layer. Substrate 204 may alternatively be composed of a group III-V material. In an embodiment, substrate 204 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In another embodiment, substrate 204 is composed of a III-V material and charge-carrier dopant impurity atoms such as, but not limited to, carbon, silicon, germanium, oxygen, sulfur, selenium or tellurium.

In an embodiment, the gate electrode of gate electrode stack 216 (and corresponding 216') is composed of a metal gate and the gate dielectric layer is composed of a high-K material. For example, in one embodiment, the gate dielectric, layer is composed of a material such as but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer adjacent the channel region may include a layer of native oxide formed from the top few layers of the germanium active layer 202. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In an embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In an embodiment, the gate electrode is composed of a P-type or N-type material. The gate electrode stack 216 (an correspond bottom portion 216') may also include dielectric spacers, not depicted.

The semiconductor device 200 is shown generically to cover non-planar devices, including gate-all-around devices. Such devices are described more specifically below with FIGS. 3A and 3B (general non-planar device), FIG. 4 (wrap-around fin-fet device) and FIG. 5 (nanowire-based device). In all cases, a deep gate-all-around structure is integrated with the device. The deep gate-all-around structure may be effective for suppressing the leakage in such devices. Thus, semiconductor device 200 may be a semiconductor device incorporating a gate, a channel region and a pair of source/drain regions. In an embodiment, semiconductor device 200 is one such as but not limited to, a MOS-FET or a Microelectromechanical System (MEMS). In one embodiment, semiconductor device 200 is a planar or three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

Figure 3A:
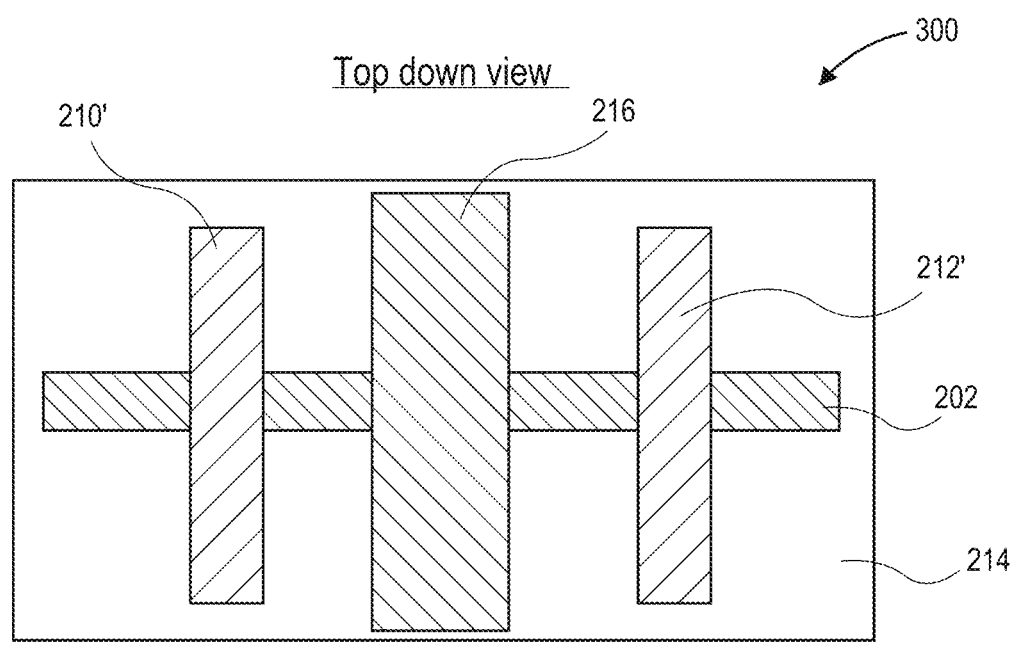
FIG. 3A illustrates a schematic top-down views of a non-planar semiconductor device having a germanium active layer and a deep gate all-around structure, in accordance with an embodiment of the present invention.
Figure 3B:
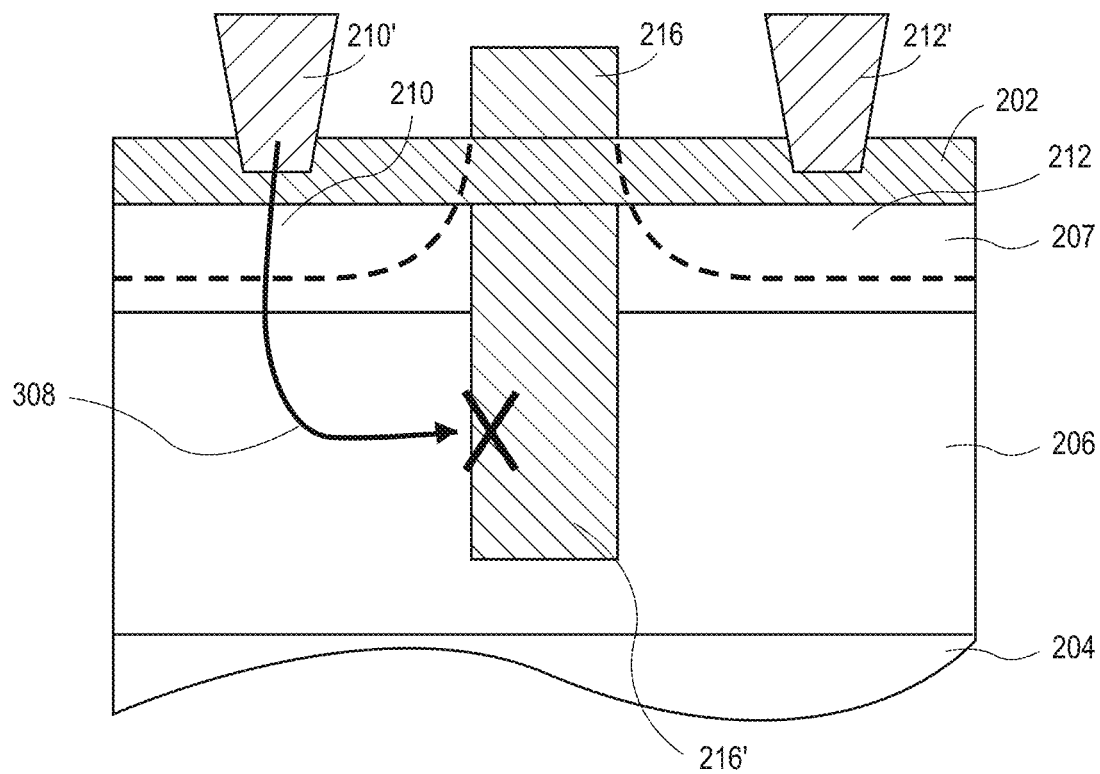
FIG. 3B illustrates a schematic cross-sectional view of the non-planar semiconductor device of FIG. 3A, in accordance with an embodiment of the present invention.

As an example, FIGS. 3A and 3B illustrate schematic top-down and cross-sectional views, respectively, of a non-planar semiconductor device having a germanium active layer and a deep gate all-around structure, in accordance with an embodiment of the present invention.

Referring to FIGS. 3A and 3B, a non-planar semiconductor device 300 includes a first buffer layer 206 disposed above a substrate 204. A second butler layer 207 is disposed above the first buffer layer 206. A germanium active layer 202 is disposed above the second buffer layer 207. A gate electrode stack including top portion 216 and bottom portion 216' is disposed to surround the germanium active layer 202. Source and drain regions 210/212, and corresponding contacts 210' and 212', are disposed in the germanium active layer 202 and partially in the second buffer layer 207 on either side of the gate electrode stack (216+216'). More specifically, in an embodiment, the source and drain regions 210/212 are formed by doping portions of the germanium active layer 202 and in the second buffer layer 207, as depicted in FIG. 3. As depicted in FIG. 3, semiconductor device 300 may also include isolation regions 214. In an embodiment, bottom portion 216' of the gate stack is a deep gate stack, leaned well below source and drain regions 212 and 210, and acts to block, a leakage path 308 from source region 210 to drain region 212. It is to be understood that like feature designations of FIG. 3 may be as described above in association with FIG. 2.

As mentioned above, embodiments of the present invention may be applied to non-planar MOS-FETs such as fin-fet type devices having a gate-all-around portion. For example, FIG. 4 illustrates an angled view of a fin-fet type semiconductor device having a germanium active layer and a deep gate all-around structure, in accordance with an embodiment of the present invention.

Referring to FIG. 4, a non-planar semiconductor device 400 includes a first buffer layer 206 disposed above a substrate 204. A second buffer layer 207 is disposed above the first buffer layer 206. A three-dimensional germanium active layer 202 is disposed above the second buffer layer 207. A gate electrode stack 216, including gate electrode 216B and gate dielectric 216A, is disposed on and completely surrounds the three-dimensional germanium active layer 202, although the portion wrapping underneath region 202 cannot be viewed from this perspective. Source and drain regions 210/212 are disposed on either side of the gate electrode stack 216. Also depicted are isolation regions 214 and gate electrode spacers 440. In accordance with an embodiment of the present invention, gate electrode stack 216 is a deep gate-all-around structure which extends into first buffer layer 206.

Although depicted in FIG. 4 as being somewhat aligned with the bottom of the first buffer layer 206, it is to be understood that the depth of the isolation regions 214 may vary. Also, although depicted in FIG. 4 as being somewhat aligned with the top of the second buffer layer 207, it is to be understood that the height of the isolation regions 214 may vary. It is also to be understood that like feature designations of FIG. 4 may be as described in association with FIG. 2.

In another aspect. FIG. 5A illustrates a three-dimensional cross-sectional view of a germanium nanowire-based semiconductor structure, in accordance with an embodiment of the present invention. FIG. 5B illustrates a cross-sectional channel view of the germanium nanowire-based semiconductor structure of FIG. 5A, as taken along the a-a' axis. FIG. 5C illustrates a cross-sectional spacer view of the germanium nanowire-based semiconductor structure of FIG. 5A, as taken along the b-b' axis.

Referring to FIG. 5A, a semiconductor device 500 includes one or more vertically stacked germanium nanowires (550 set) disposed above a substrate 204. Embodiments herein are targeted at both single wire devices and multiple wire devices. As an example, a three nanowire-based devices having nanowires 550A, 550B and 550C is shown for illustrative purposes. For convenience of description, nanowire 550A is used as an example where description is focused on only one of the nanowires. It is to be understood that where attributes of one nanowire are described, embodiments based on a plurality of nanowires may have the same attributes for each of the nanowires.

At least the first nanowire 550A includes a germanium channel region 202. The germanium channel region 202 has a length (L). Referring to FIG. 5B, the germanium channel region 202 also has a perimeter orthogonal to the length (L). Referring again to FIG. 5B, a gate electrode stack 216 surrounds the entire perimeter of each of the channel regions of each nanowire 550, including germanium channel region 202. The gate electrode stack 216 includes a gate electrode along with a gate dielectric layer disposed between the channel regions and the gate electrode (not individually shown). The germanium channel region 202 and the channel regions of the additional nanowires 550B and 550C are discrete in that they are completely surrounded by the gate electrode stack 216 without any intervening material such as underlying substrate material or overlying channel fabrication materials. Accordingly, in embodiments having a plurality of nanowires 550, the channel regions of the nanowires are also discrete relative to one another, as depicted in FIG. 5B.

Referring to FIGS. 5A-5C, a second buffer layer 207 is disposed above a first buffer layer 206 which is disposed above the substrate 204. As shown in FIG. 5B, underneath the channel region, the gate electrode stack 216 is formed into the second buffer layer 207 and partially into the first buffer layer 206. Referring again to FIG. 5A each of the nanowires 550 also includes source and drain regions 210 and 212 disposed in the nanowire on either side of the channel regions, including on either side of germanium channel region 202. In an embodiment, the source and drain regions 210/212 are embedded source and drain regions, e.g., at least a portion of the nanowires is removed and replaced with a source/drain material region. However, in another embodiment, the source and drain regions 210/212 are composed of doped portions of the one or more germanium nanowires 550.

A pair of contacts 570 is disposed over the source/drain regions 210/212. In an embodiment, the semiconductor device 500 further includes a pair of spacers 540. The spacers 540 are disposed between the gate electrode stack 216 and the pair of contacts 570. As described above, the channel regions and the source/drain regions are, in at least several embodiments, made to be discrete. However, not all regions of the nanowires 550 need be, or even can be made to be discrete. For example, referring to FIG. 5C, nanowires 550A-550C are not discrete at the location under spacers 540. In one embodiment, the stack of nanowires 550A-550C includes intervening semiconductor material 580 there between, such as silicon germanium or silicon intervening between germanium nanowires. In one embodiment, the bottom nanowire 550A is still in contact with a portion of a second buffer layer 207. Thus, in an embodiment, a portion of the plurality of vertically stacked nanowires 550 under one or both of the spacers 540 is non-discrete.

It is to be understood that like feature designations of FIGS. 5A-5C may be as described in association with FIG. 2. Also, although the device 500 described above is for a single device, a CMOS architecture may also be formed to include both NMOS and PMOS nanowire-based devices disposed on or above the same substrate. In an embodiment, the nanowires 550 may be sized as wires or ribbons, and may have squared-off or rounded corners.

Furthermore, in an embodiment, the nanowires 550 may be made discrete (at least at the channel regions) during a replacement gate process. In one such embodiment, portions of germanium layers ultimately become channel regions in a nanowire-based structure. Thus, at the process stage of exposing the channel regions upon, a dummy gate removal, channel engineering or tuning may be performed. For example, in one embodiment, the discrete portions of the germanium layers are thinned using oxidation and etch processes. Such an etch process may be performed at the same time the wires are separated or individualized. Accordingly, the initial wires formed from germanium layers may begin thicker and are thinned to a size suitable for a channel region in a nanowire device, independent from the sizing of the source and drain regions of the device. Following formation of such discrete channel regions, high-k gate dielectric and metal gate processing may be performed and source and drain contacts may be added.

Figure 6:
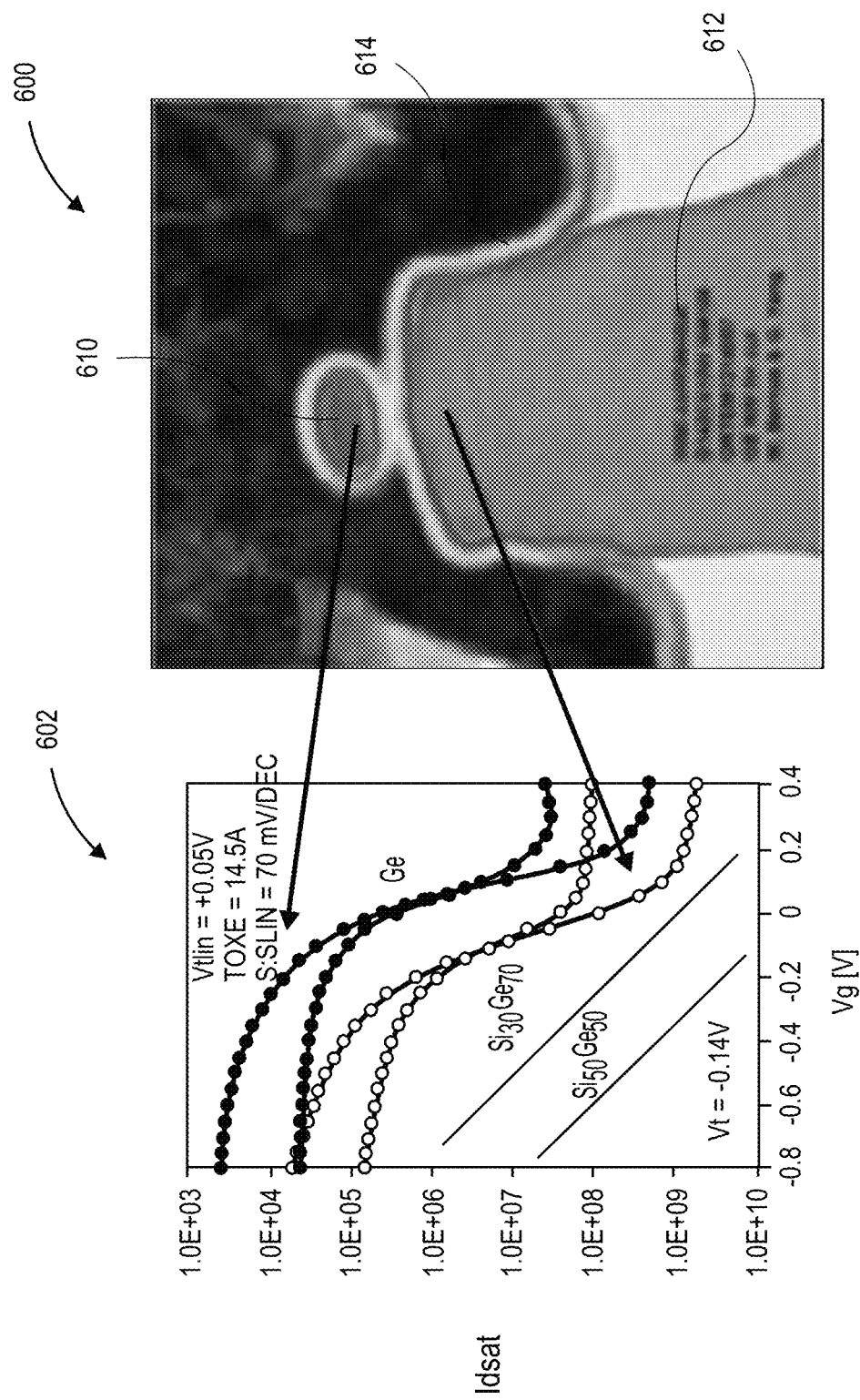
FIG. 6 includes a tunneling electron microscope (TEM) image of a cross-sectional view taken along the channel region of a germanium-based device, and a corresponding plot of saturated current (Idsat) as a function of gate voltage (Vg) corresponding to layers in the germanium-based device, in accordance with an embodiment of the present invention.

As described above, one or more embodiments include formation of a deep gate-all-around structure that extends into several layer of a hetero-structure stack of materials. In one such embodiment, a high mobility and low bandgap material is used as a channel region. The high mobility and low bandgap material is disposed on high bandgap material which, in turn is disposed on a medium band gap material. In a specific example involving germanium-based structures, a channel region is composed of essentially pure germanium. In regions other than the channel region (where a the gate is wrapped around the germanium layer), the germanium layer is disposed on $Si_{50}Ge_{50}$, which has a higher ban gap than germanium. The $Si_{50}Ge_{50}$ is disposed on a $Si_{30}Ge_{70}$ layer, with a band gap intermediate to the $Si_{50}Ge_{50}$ and the Ge. FIG. 6 includes a tunneling electron microscope (TEM) image 600 of a cross-sectional view taken along the channel region of a germanium-based device, and a corresponding plot 602 of saturated current (Idsat) as a function of gate voltage (Vg) corresponding to layers in the germanium-based device, in accordance with an embodiment of the present invention.

Referring to image 600 of FIG. 6, a germanium channel 610 is disposed above a $S_{30}Ge_{70}$ layer (fin) 612. A gate stack 614 surrounds the germanium layer at the channel region 610. It is to be understood that at regions other than the channel region, in one embodiment, a layer of $Si_{50}Ge_{50}$ is disposed between the germanium layer and the $Si_{30}Ge_{70}$ layer, and the gate stack 614 is not present at those locations (e.g., at the source and drain regions). Referring to plot 602, the Ge layer has much higher Idsat than the corresponding $Si_{30}Ge_{70}$ layer, and would be even higher than the $Si_{50}Ge_{50}$, as shown in FIG. 6. As such, although formation of a deep gate-all-around structure involves formation of a gate stack deep into other layers of a hetero-structure stack of materials, the corresponding interaction of the gate stack with the layers other than the channel layer do not interfere with the high performance of the fabricated device. More specifically, there is little to no turn on in the other layers that impacts gate performance. And, perhaps most importantly, the deep gate structure can act to suppress leakage in the off-state of the device.

Thus, one or more embodiments described herein are targeted at germanium or group material active region arrangements integrated with deep gate-all-around gate electrode stacks. Such arrangements may be included to form germanium or Group III-V material based transistors such as non-planar devices, fin or tri-gate based devices, and gate all around devices, including nanowire-based devices. Embodiments described herein may be effective for junction isolation in metal-oxide-semiconductor field effect transistors (MOSFETs). It is to be understood that formation of materials such as first and second buffer layers 206/207 and the germanium active region 202 may be formed by techniques such as, but not limited to, chemical vapor deposition (CVD) or molecular beam epitaxy (MBE), or other like processes.

Figure 7:
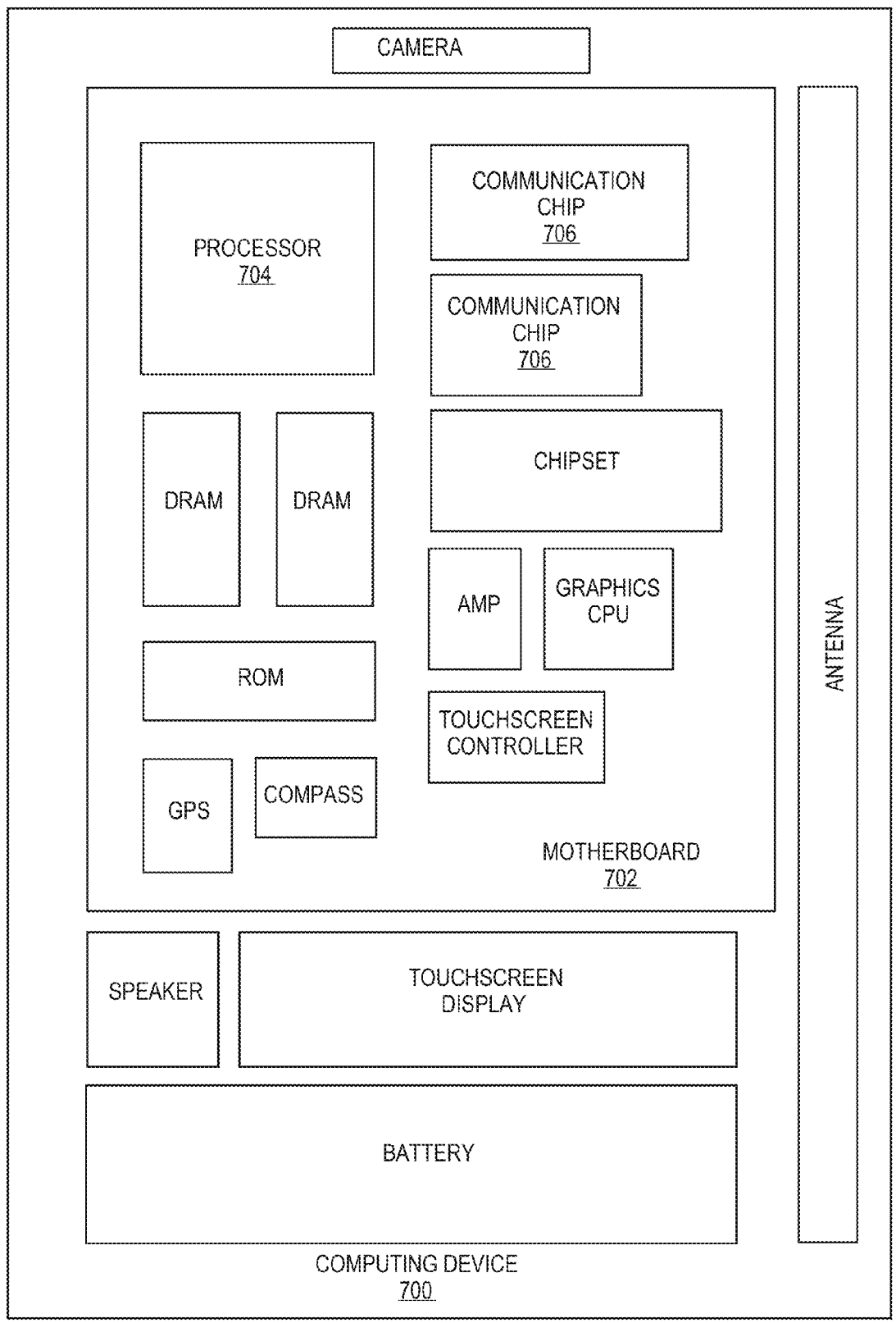
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 nay be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a nethook, a notebook, an ultrahook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments of the present invention include deep gate-all-around semiconductor devices having germanium or group III-V active layers.

In an embodiment, a non-planar semiconductor device includes a hetero-structure disposed above a substrate. The hetero-structure includes a hetero-junction between an upper layer and a lower layer of differing composition. An active layer is disposed above the hetero-structure and has a composition different from the upper and lower layers of the hetero-structure. A gate electrode stack is disposed on and completely surrounds a channel region of the active layer, and is disposed in a trench in the upper layer and at least partially in the lower layer of the hetero-structure. Source and drain regions are disposed in the active layer and in the upper layer, but not in the lower layer, on either side of the gate electrode stack.

In one embodiment, the channel region of the active layer has a lower hand gap than the lower layer, and the lower layer has a lower band gap than the upper layer.

In one embodiment, the channel region of the active layer consists essentially of germanium, the lower layer is composed of $Si_xGe_{1-x}$, and the upper layer is composed of $Si_yGe_{1-y}$, where y>x.

In one embodiment, y is approximately 0.5, and x is approximately 0.3.

In one embodiment, the channel region of the active layer, the lower layer, and the upper layer each is composed of a different group III-V material.

In one embodiment, the gate electrode stack is disposed to a depth in the hetero-structure approximately 2-4 times a depth of the source and drain regions in the hetero-structure.

In one embodiment, the device further includes isolation regions adjacent the source and drain regions and disposed at least partially into the hetero-structure.

In one embodiment, the gate electrode stack is disposed to a depth in the hetero-structure deeper than a depth of the isolation regions.

In one embodiment, the gate electrode stack is composed of a high-k gate dielectric layer lining the trench, and a metal gate electrode within the high-k gate dielectric layer.

In one embodiment, the device further includes one or more nanowires disposed in a vertical arrangement above the active layer, and the gate electrode stack is disposed on and completely surrounds a channel region of each of the nanowires.

In an embodiment, a non-planar semiconductor device includes a buffer layer disposed on a substrate. An active layer is disposed on the buffer layer. A gate electrode stack is disposed on and completely surrounds a channel region of the active layer, and is disposed in a trench in the buffer layer. Source and drain regions are disposed in the active layer and in the buffer layer, on either side of the gate electrode stack. The gate electrode stack is disposed to a depth in the buffer layer sufficiently below a depth of the source and drain regions in the buffer layer to block a substantial portion of leakage from the source region to the drain region.

In one embodiment, the channel region of the active layer has a lower band gap than any portion of the buffer layer.

In one embodiment, the channel region of the active layer consists essentially of germanium, and the buffer layer is composed of silicon germanium.

In one embodiment, the active layer and the butler layer each are composed of a group III-V material.

In one embodiment, the gate electrode stack is disposed to a depth in the buffer layer approximately 2-4 times the depth of the source and drain regions in the buffer layer.

In one embodiment, the device further includes isolation regions adjacent the source and drain regions and disposed at least partially into the buffer layer.

In one embodiment, the gate electrode stack is disposed to a depth in the buffer layer deeper than a depth of the isolation regions.

In one embodiment, the gate electrode stack is composed of a high-k gate dielectric layer lining, the trench, and a metal gate electrode within the high-k gate dielectric layer.

In one embodiment, the device further includes one or more nanowires disposed in a vertical arrangement above the active layer, and the gate electrode stack is disposed on and completely surrounds a channel region of each of the nanowires.

In an embodiment, a method of fabricating a non-planar semiconductor device includes forming a hetero-structure above a substrate. The hetero-structure includes a hetero-junction between an upper layer and a lower layer of differing composition. An active layer is formed above the hetero-structure and has a composition different from the upper and lower layers of the hetero-structure. A trench is formed in the upper layer and at least partially in the lower layer. A gate electrode stack is formed on and completely surrounds a channel region of the active layer, and in the trench in the upper layer and at least partially in the lower layer. Source and drain regions are formed in the active layer and in the upper layer, but not in the lower layer, on either side of the gate electrode stack.

In one embodiment, forming the trench in the upper layer and at least partially in the lower layer is performed subsequent to removal of a dummy gate structure in a replacement gate process.

In one embodiment, the channel region of the active layer has a lower band gap than the lower layer, and the lower layer has a lower band gap than the upper layer.

In one embodiment, the channel region of the active layer consists essentially of germanium, the lower layer is composed of $Si_xGe_{1-x}$, and the upper layer is composed of $Si_yGe_{1-y}$, where y>x.

In one embodiment, y is approximately 0.5, and x is approximately 0.3.

In one embodiment, the channel region of the active layer, the lower layer, and the upper layer each are composed of a different group III-V material.

In one embodiment, the gate electrode stack is formed to a depth in the hetero-structure approximately 2-4 times a depth of the source and drain regions in the hetero-structure.

In one embodiment, the method further includes forming isolation regions adjacent the source and drain regions at least partially into the hetero-structure.

In one embodiment, the gate electrode stack is formed to a depth in the hetero-structure deeper than a depth of the isolation regions.

In one embodiment, the gate electrode stack is composed of a high-k gate dielectric layer lining the trench, and a metal gate electrode within the high-k gate dielectric layer.

In one embodiment, the method further includes forming one or more nanowires in a vertical arrangement above the active layer, and the gate electrode stack is formed on and completely surrounds a channel region of each of the nanowires.

What is claimed is:

1. A non-planar semiconductor device, comprising:
 a buffer layer disposed above a substrate;
 an active layer disposed above the buffer layer;
 a gate electrode stack disposed on and completely surrounding a channel region of the active layer, and disposed in a trench in the buffer layer;
 source and drain regions disposed adjacent the channel region, on either side of the gate electrode stack; and
 isolation regions adjacent the source and drain regions and disposed at least partially into the buffer layer, wherein the gate electrode stack is disposed to a depth in the buffer layer deeper than a depth of the isolation regions.

2. The non-planar semiconductor device of claim 1, wherein the channel region of the active layer has a lower band gap than any portion of the buffer layer.

3. The non-planar semiconductor device of claim 2, wherein the channel region of the active layer consists essentially of germanium, and the buffer layer comprises silicon germanium.

4. The non-planar semiconductor device of claim 2, wherein the active layer and the buffer layer each comprise a group III-V material.

5. The non-planar semiconductor device of claim 1, wherein the gate electrode stack is disposed to a depth approximately 2-4 times a depth of the source and drain regions.

6. The non-planar semiconductor device of claim 1, wherein the gate electrode stack comprises a high-k gate dielectric layer lining the trench, and a metal gate electrode within the high-k gate dielectric layer.

7. The non-planar semiconductor device of claim 1, further comprising:
 one or more nanowires disposed in a vertical arrangement above the active layer, wherein the gate electrode stack is disposed on and completely surrounds a channel region of each of the nanowires.

8. A method of fabricating a non-planar semiconductor device, the method comprising:
 forming a buffer layer above a substrate;
 forming an active layer above the buffer layer;
 forming isolation regions at least partially into the buffer layer;
 forming a trench in the buffer layer below a channel region of the active layer to a depth below the isolation regions;
 forming a gate electrode stack in the trench and on the channel region of the active layer; and
 forming source and drain regions adjacent the channel region, on either side of the gate electrode stack.

9. The method of claim 8, wherein the channel region of the active layer has a lower band gap than any portion of the buffer layer.

10. The method of claim 9, wherein the channel region of the active layer consists essentially of germanium, and the buffer layer comprises silicon germanium.

11. The method of claim 9, wherein the active layer and the buffer layer each comprise a group III-V material.

12. The method of claim 8, wherein the gate electrode stack is formed to a depth in the buffer layer approximately 2-4 times a depth of the source and drain regions.

13. The method of claim 8, wherein forming the gate electrode stack comprises forming a high-k gate dielectric layer lining the trench, and forming a metal gate electrode within the high-k gate dielectric layer.

14. The method of claim 8, further comprising:
 forming one or more nanowires in a vertical arrangement above the active layer, wherein the gate electrode stack is formed on and completely surrounds a channel region of each of the nanowires.

* * * * *